United States Patent
Baldwin et al.

(10) Patent No.: US 11,665,849 B2
(45) Date of Patent: May 30, 2023

(54) FIRE SHIELD FOR VARIABLE FREQUENCY DRIVE ENCLOSURE

(71) Applicant: ABB Schweiz AG, Baden (CH)

(72) Inventors: Brian J. Baldwin, Summit, WI (US); Stephen C. Zenobia, IV, Houston, TX (US); Charles J. Paddock, Mukwonago, WI (US)

(73) Assignee: ABB Schweiz AG, Baden (CH)

( * ) Notice: Subject to any disclaimer, the term of this patent is extended or adjusted under 35 U.S.C. 154(b) by 352 days.

(21) Appl. No.: 16/898,701

(22) Filed: Jun. 11, 2020

(65) Prior Publication Data

US 2021/0391697 A1 Dec. 16, 2021

(51) Int. Cl.
*H05K 7/20* (2006.01)
*H05K 5/04* (2006.01)

(52) U.S. Cl.
CPC .......... *H05K 7/20145* (2013.01); *H05K 5/04* (2013.01)

(58) Field of Classification Search
CPC .......... H02B 1/28; H05K 5/0213; H05K 5/04; H05K 7/1495; H05K 7/20145; G06F 1/187
See application file for complete search history.

(56) References Cited

U.S. PATENT DOCUMENTS

| | | | |
|---|---|---|---|
| 4,307,813 A * | 12/1981 | Palmer | H02B 1/28 106/18.11 |
| 4,742,864 A * | 5/1988 | Duell | H05K 7/20145 165/47 |
| 5,499,734 A * | 3/1996 | Tessmer | H05K 5/0213 220/4.21 |
| 5,666,268 A | 9/1997 | Rix et al. | |
| 6,147,867 A | 11/2000 | Gaudrel et al. | |
| 6,381,134 B2 * | 4/2002 | Iwasaki | H05K 7/20145 165/122 |
| 6,400,567 B1 * | 6/2002 | McKeen | H05K 7/20145 361/695 |
| D470,104 S * | 2/2003 | Owen | D13/119 |
| 6,654,242 B2 * | 11/2003 | Ogawa | G06F 1/20 361/679.48 |

(Continued)

FOREIGN PATENT DOCUMENTS

DE 602005005332 T2 1/2009

OTHER PUBLICATIONS

Drives, Soft Starters and Harmonic Filters; Feb. 11, 2018; EMA Medium and Low Voltage Drives; https://www.emainc.net/drives-soft-starters-harmonic-filters/ (extracted Jul. 24, 2022). (Year: 2018).*

(Continued)

*Primary Examiner* — Adrian S Wilson
(74) *Attorney, Agent, or Firm* — Leydig, Voit & Mayer, Ltd.

(57) ABSTRACT

The fire shield enclosure makes use of a set of external metal shields that can be attached to a wall mounted variable frequency drive (VFD) in the field either before or after the VFD has been installed for the purpose of providing adequate protection from a fire as defined by a UL2043: Fire Test for Heat and Visible Smoke Release (UL2043 fire test). The fire shield enclosure pertains to a VFD for which may use a polymer material as an integral part of its enclosure housing.

17 Claims, 6 Drawing Sheets

(56) References Cited

U.S. PATENT DOCUMENTS

| | | | | |
|---|---|---|---|---|
| 7,201,651 B2* | 4/2007 | Su | ............ | H05K 5/0213 |
| | | | | 361/695 |
| 8,403,431 B2* | 3/2013 | Elkins | ............ | H04Q 1/11 |
| | | | | 312/265.3 |
| 10,863,638 B2* | 12/2020 | Freer | ............ | H05K 5/0213 |
| 2010/0118507 A1 | 5/2010 | Weiss et al. | | |
| 2010/0208433 A1* | 8/2010 | Heimann | ............ | H04Q 1/112 |
| | | | | 29/407.01 |
| 2010/0284150 A1* | 11/2010 | Manahan | ............ | F28F 7/00 |
| | | | | 361/695 |
| 2012/0087085 A1* | 4/2012 | Moore | ............ | H05K 7/1495 |
| | | | | 361/679.46 |
| 2013/0298418 A1* | 11/2013 | Salisbury | ............ | F26B 21/06 |
| | | | | 34/88 |
| 2021/0099044 A1* | 4/2021 | Campos | ............ | H02H 7/0833 |
| 2022/0220835 A1* | 7/2022 | Guimarães | ............ | F04D 29/5813 |

OTHER PUBLICATIONS

LSIS H100 Series Brochure; Oct. 2017; LSIS Co., Ltd.; https://cdn.shopify.com/s/files/1/0020/2040/9413/files/LSIS_H100_Series_Brochure.pdf?9931264754148833992 (extracted Jul. 24, 2022) (Year: 2017).*

NEMA 4x/IP66 Keypad Mount Option; 2012; LSIS Co, Ltd.; https://cdn.shopify.com/s/files/1/0020/2040/9413/files/LSIS_LSLV_S100_NEMA4X.pdf?8389591234842843035 (extracted Jul. 24, 2022) (Year: 2012).*

European Patent Office, Extended European Search Report in European Patent Application No. 21174785.2, 9 pp. (dated Nov. 16, 2021).

* cited by examiner

A

FIRE SHIELD FOR VARIABLE FREQUENCY DRIVE ENCLOSURE

BACKGROUND OF THE INVENTION

A variable frequency drive (VFD) is a type of motor controller that drives an electric motor by varying the frequency and voltage supplied to the electric motor. Other names for a VFD are variable speed drive, adjustable speed drive, adjustable frequency drive, AC drive, microdrive, and inverter.

Variable frequency drives (VFD) are typically made using polymeric material for part of their enclosures for its cost, weight and aesthetic advantages. However, polymeric material creates a lot of smoke when burned, which is undesirable and makes it difficult to pass compliance testing, such as a UL2043: Fire Test for Heat and Visible Smoke Release (UL2043 fire test).

To design an enclosure solely out of metal in order to pass the UL2043 fire test would not be practical due to business costs for the rest of the market. Therefore, an alternative solution is needed to make a VFD that is more cost effective and practical with a polymeric enclosure that can be accepted where the UL2043 fire test compliance is required.

BRIEF SUMMARY OF THE INVENTION

The invention provides an enclosure for a variable frequency drive that includes a 3D shape, upwardly directed air flow vents, an enclosure configured to conform to the 3D shape of the variable frequency drive, and a cooling air inlet or baffle having a tortious path that discourages the transfer of flames. The enclosure is a fire shield having mating air flow vents to those of the variable frequency drive.

The invention also provides a set of fire shields for a variable frequency drive including a front shield, a rear shield and an intake baffle. The front shield, the rear shield and the intake baffle are configured to mate with a variable frequency drive and are fire resistant.

BRIEF DESCRIPTION OF THE SEVERAL VIEWS OF THE DRAWING(S)

DETAILED DESCRIPTION OF THE INVENTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice versa without limiting the scope of the disclosure to the exact number or type of such elements unless set forth explicitly in the appended claims.

Figure 1:
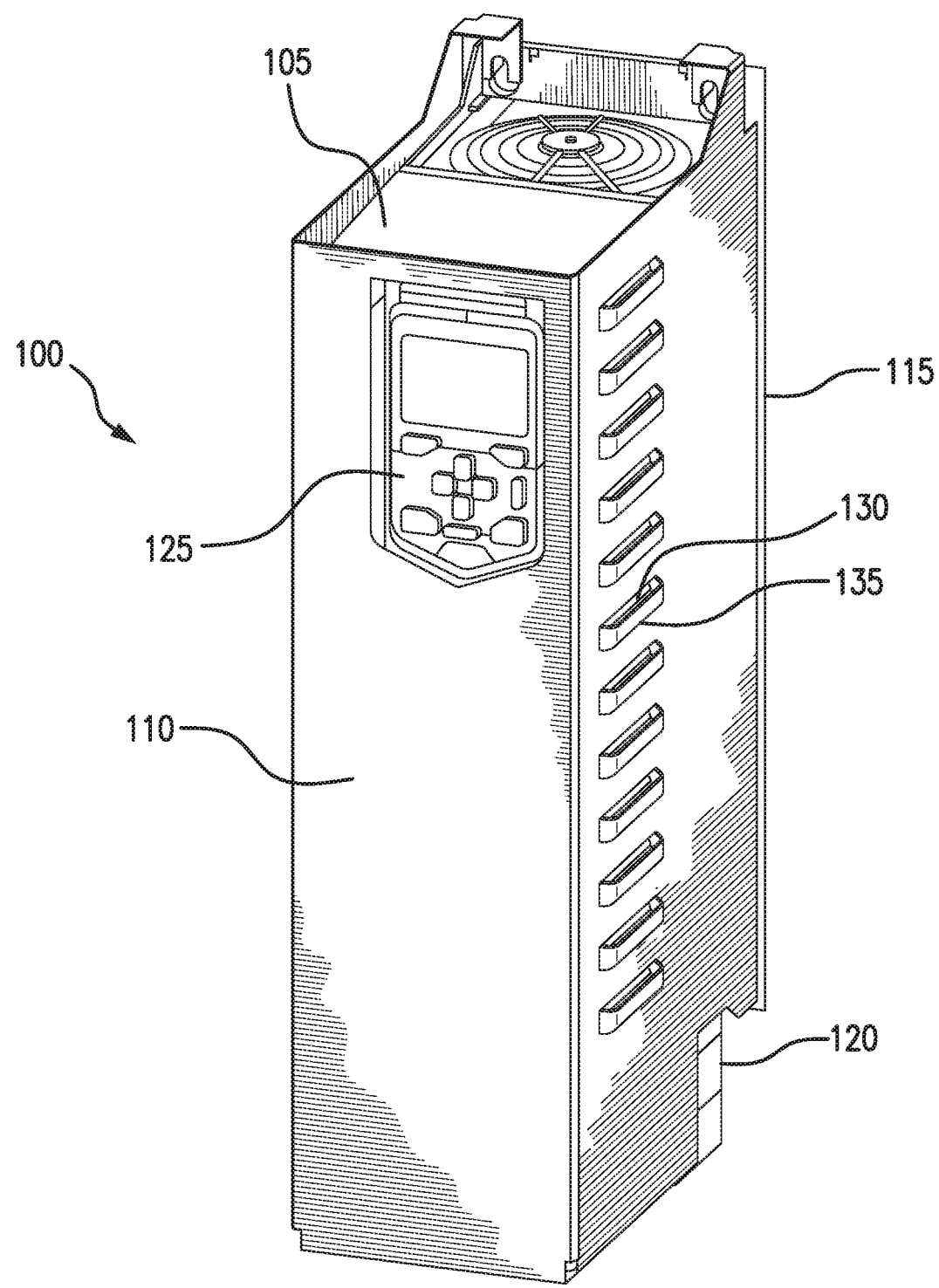
FIG. 1 is a perspective view of a fire shield enclosed variable frequency drive (VFD) according to certain embodiments of the disclosure.

Referring now to FIG. 1, there is a perspective view of a fire shield-enclosed, variable-frequency drive (VFD) 100 according to certain embodiments of the disclosure. The fire shield enclosed VFD 100 may include a VFD unit 105 enclosed by a front fire shield 110 and a rear fire shield 115. In certain embodiments, front fire shield 110 wraps around and envelopes or covers the front and sides of VFD unit 105 with the side portions of front fire shield 110 including a plurality of shield louvers 135 projecting from a side surface of fire shield 110. The plurality of louvers 135 are configured to align with a plurality of air vents 130 disposed on sides of VFD unit 105, as discussed further below in FIGS. 3 and 4. VFD 100 may also include an intake baffle 120 disposed at a bottom portion of the VFD 100. In some embodiments, the VFD unit 105 may comprise a polymeric material to reduce production costs and include a VFD control panel 125 configured to operate the VFD unit 105 as needed by a user. In certain embodiments, fire shields 110, 115 conform to the three-dimensional shape of VFD 105.

Figure 2:
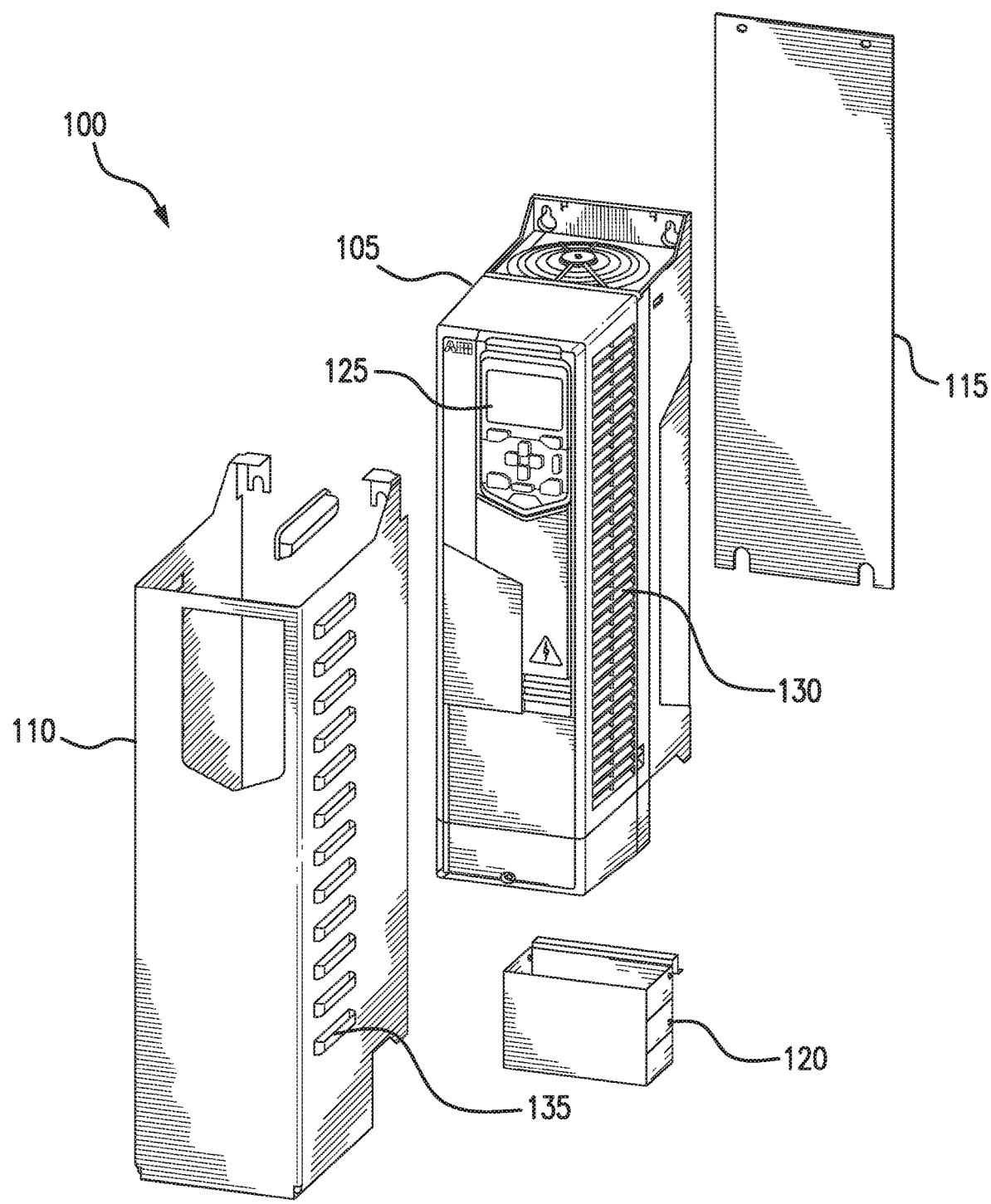
FIG. 2 is an exploded view of a fire shield enclosed VFD according to certain embodiments of the disclosure.

In some embodiments, the front fire shield 110 may be configured to wrap around the front and side portions of the VFD unit 105 upon assembly with the rear fire shield 115 disposed to cover the rear portion of the VFD unit 105 as more clearly shown in FIG. 2.

Referring now to FIG. 2, there is an exploded view of the fire shield enclosed VFD 100 according to certain embodiments of the disclosure. The present disclosure is directed to a fire shield enclosed VFD 100 with certain embodiments including a VFD 105 comprised of a polymeric material housing enclosed by fire shields 110, 115. The fire shields 110, 115 are configured to provide adequate protection to pass a fire test, such as a UL2043: Fire Test for Heat and Visible Smoke Release (UL2043 fire test). In certain embodiments, fire shields 110, 115 are needed to protect the polymeric housing material of VFD unit 105 since such material may create a lot of heat and smoke which typically do not comply with the UL2043 fire test.

In certain embodiments, it can be appreciated that the use of the fire shields at 110 and 115 will allow the VFD 105 being usually comprised of a polymeric material to comply with the UL2043 fire test without having to make changes to the base design of the VFD unit 105, because any such changes to the base design would likely have a large impact on product cost and weight. In the illustrated embodiment, rear fire shield 115 is configured with no overlap lip at any contact points to front fire shield 110, but in alternative embodiments, rear fire shield 115 and intake baffle 120 may be a unitary or have a combined configuration, for example, lips, flanges and other structures to interconnect the two shield portions with one another to form a unitary structure.

In some embodiments, a set of fire shields at 110 and 115 made out of metal can be configured to be attached to a VFD unit 105 to create a fire barrier enclosure around the VFD unit 105. Certain embodiments comprise of a back plate 115, main cover 110 and an intake baffle 120 which will all be used in combination to enclose or cover the VFD unit 105.

The back plate 115 may not be needed in some designs where the back of the VFD 105 enclosure is already made of metal. In some embodiments, intake baffle 120 may be replaced by a metal grill (not shown) where it is found that this is enough to comply with the requirements of the UL2043 fire test.

In certain embodiments, shields 110, 115 provide adequate protection against fire per the requirements of the UL2043 fire test. In some embodiments, shields 110, 115 may also be considered to be an enclosure made of metal and therefore no need to be investigated further by the UL2043 fire test requirements, meaning they do not need to be tested.

Figure 3:
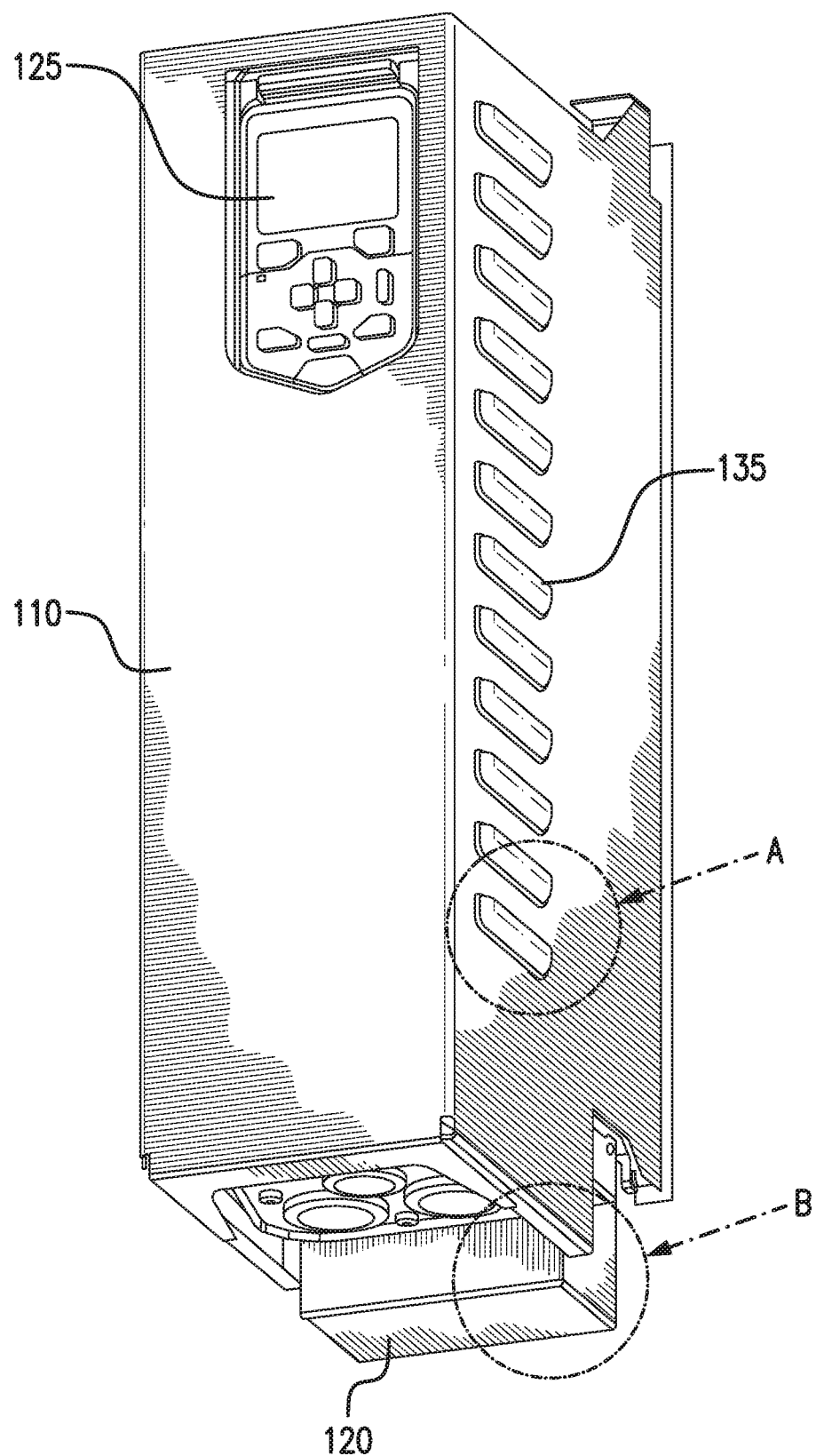
FIG. 3 is a perspective view of VFD unit according to certain embodiments of the disclosure.

Referring to FIG. 3, there is a perspective view of VFD unit 105 according to certain embodiments of the disclosure. In certain embodiments, the fire shield 110 may include side louvers 135 configured to be directed to vent in an upward, or upside-down, direction away from the intake baffle 120, as shown. Such a configuration may allow for airflow that reduces smoke and fire progression within VFD unit 105. As can be appreciated, such orientation of the louvers 135 is unconventional.

Figure 4:
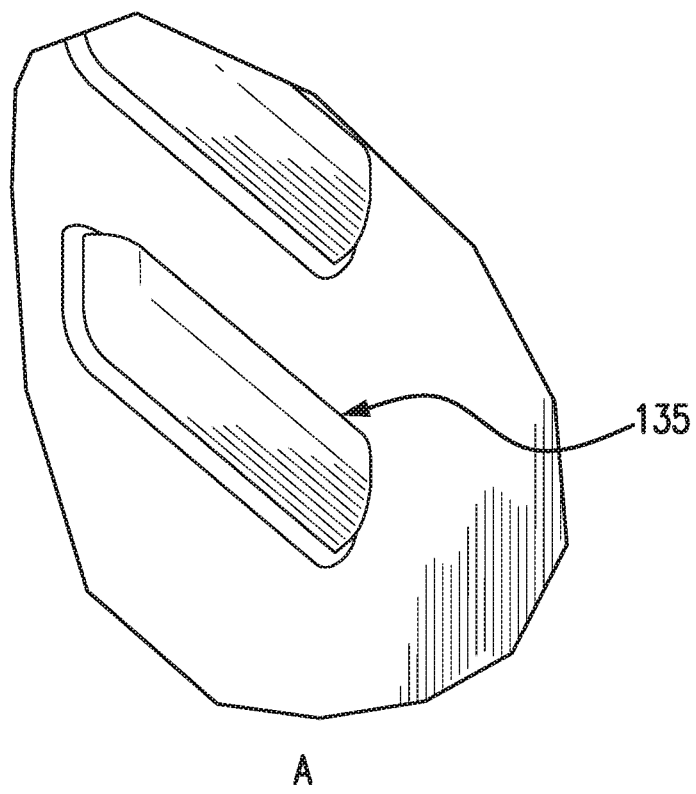
FIG. 4 is an enlarged perspective view of section A of FIG. 3 according to certain embodiments of the disclosure.

Referring to FIG. 4, there is an enlarged perspective view of section A of FIG. 3 according to certain embodiments of the disclosure. In some embodiments, as discussed above, having an upside-down louver 135 is capable of directing air flow to draw smoke and fire progression away from VFD unit 105 to reduce heat and smoke damage.

Figure 5:
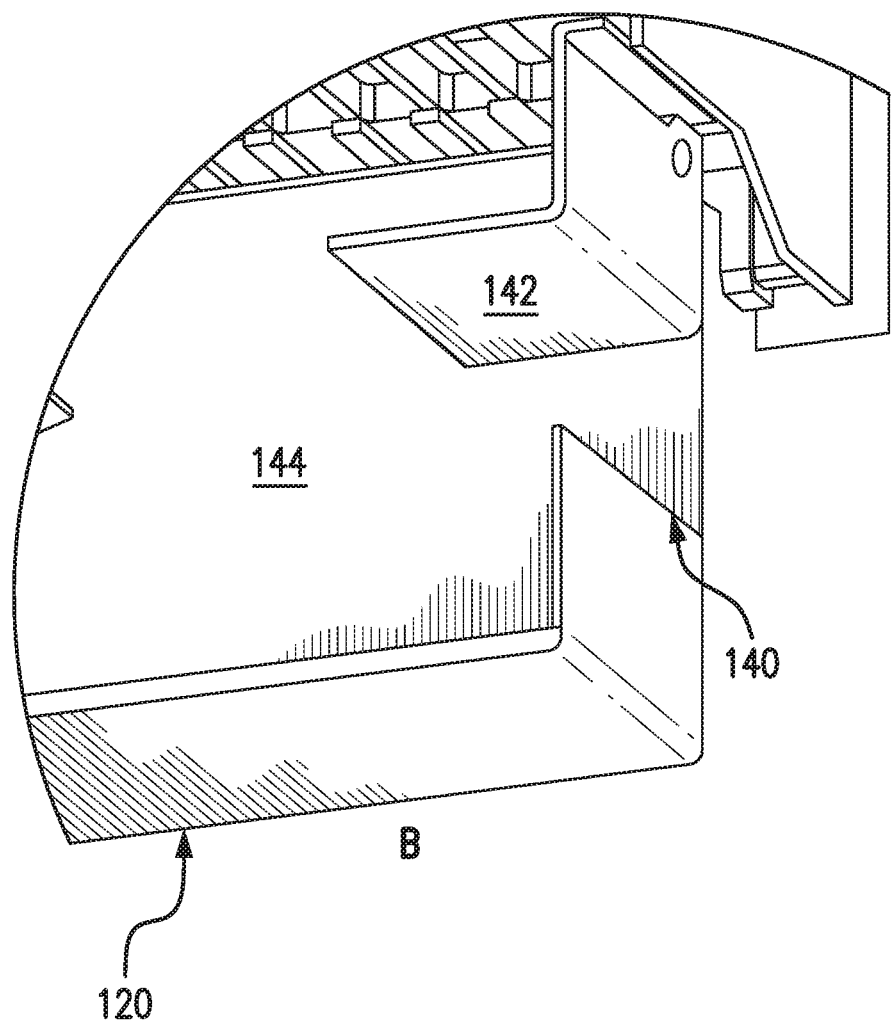
FIG. 5 is an enlarged perspective view of section B of FIG. 3 according to certain embodiments of the disclosure.

Referring to FIG. 5, there is an enlarged perspective view of section B of FIG. 3 according to certain embodiments of the disclosure. In certain embodiments, intake baffle 120 may include an internal duct intake portion 140 configured in such a manner as to direct flames through internal ducts to lessen the effect of such flames to prevent any fire progression within the VFD unit 105. As can be seen in FIG. 5, air entering through a side-opening of the baffle 120 (right side shown), is prevented from moving upward towards the VFD 105 by a plate 142 disposed between the opening 140 and an air inlet 144, which leads to a bottom surface of the VFD 105.

Figure 6:
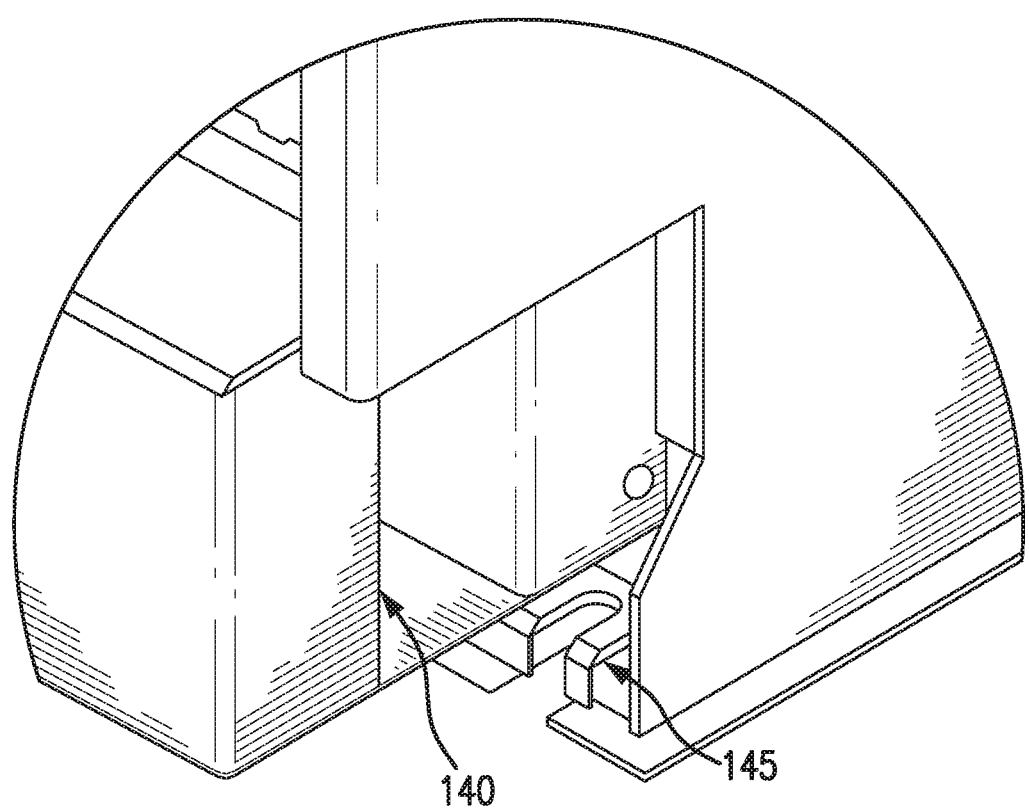
FIG. 6 is a perspective view of an intake baffle according to certain embodiments of the disclosure.

Referring to FIG. 6, there is a perspective view of the intake baffle 120 according to certain embodiments of the disclosure. In some embodiments, intake baffle 120 may include the internal duct intake portion 140 and a bottom mount portion 145. As discussed above, the internal duct intake portion 140 may be configured in such a way that it allows intake cooling air to the VFD 105 to enter but deters any flame from a fire from entering by making an internal duct at 140 to the baffle 120 such that any flame or air has to take several turns before entering the VFD 105.

In certain embodiments, the combination of fire shields 110, 115 and intake baffle 120 are used to provide adequate protection from fire as described by the UL2043 fire test for a VFD unit 105 in a plenum environment.

Certain embodiments provide the advantages over most VFD 105 being made using polymeric enclosures for lower cost and weight, but failing the UL2043 fire test. Certain embodiments allow the manufacturer to leverage those advantages and only use the shields 110, 115 in applications where they are explicitly needed, depending on applications.

Some embodiments allow an end user of a VFD 105 of limited or primarily polymeric construction to install the product in an area designated as a plenum for which the acceptance to be installed in said plenum is to comply, for example, with the UL2043 fire test or the like.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An enclosed variable frequency drive, comprising:
   a variable frequency drive having a 3D shape and upwardly directed air flow vents;
   an enclosure configured to conform to the 3D shape of the variable frequency drive; and
   an intake baffle disposed at a bottom portion of the variable frequency drive,
   wherein the enclosure is a fire shield having mating air flow vents to those of the variable frequency drive, and
   wherein the intake baffle includes an air inlet, a plate disposed above the air inlet, and an internal duct portion disposed below the air inlet so as to allow cooling air flow but to deter flame progression.

2. The enclosed variable frequency drive of claim 1, wherein the fire shield is comprised of metal.

3. The enclosed variable frequency drive of claim 1, wherein the fire shield includes a front portion and a rear portion matable with the front portion.

4. The enclosed variable frequency drive of claim 1, wherein the variable frequency drive 3D shape includes a housing comprised of a polymer material.

5. The enclosed variable frequency drive of claim 1, wherein the fire shield is configured to be UL2043: Fire Test for Heat and Visible Smoke Release compliant.

6. The enclosed variable frequency drive of claim 1, wherein the intake baffle is comprised of metal.

7. The enclosed variable frequency drive of claim 1, wherein the intake baffle is configured to be UL2043: Fire Test for Heat and Visible Smoke Release compliant.

8. The enclosed variable frequency drive of claim 3, wherein front portion connects to the rear portion of the fire shield upon assembly.

9. The enclosed variable frequency drive of claim 8, further comprising an intake baffle that connects to the rear portion of the fire shield upon assembly.

10. A set of fire shields for a variable frequency drive, comprising:
   a front shield;
   a rear shield; and
   an intake baffle disposed at a bottom portion of the variable frequency drive,
   wherein the front shield, the rear shield and the intake baffle are configured to mate with a variable frequency drive and are fire resistant,
   wherein the intake baffle connects to the front shield and the rear shield of the set of fire shields upon assembly, and
   wherein the intake baffle includes an air inlet, a plate disposed above the air inlet, and an internal duct portion disposed below the air inlet so as to allow cooling air flow but to deter flame progression.

11. The set of fire shields for a variable frequency drive of claim 10, wherein the front shield and the rear shield are comprised of metal.

12. The set of fire shields for a variable frequency drive of claim 10, wherein the intake baffle is comprised of metal.

13. The set of fire shields for a variable frequency drive of claim 10, wherein the front shield and the rear shield are configured to be mounted to each other upon assembly.

14. The set of fire shields for a variable frequency drive of claim 10, wherein the front shield, the rear shield and the intake baffle are configured to comply with a UL2043: Fire Test for Heat and Visible Smoke Release.

15. The set of fire shields for a variable frequency drive of claim 10, wherein the front shield, the rear shield and the intake baffle are configured to be assembled as an empty shell to enclose the variable frequency drive upon insertion therein.

16. The set of fire shields for a variable frequency drive of claim 10, wherein the front shield, the rear shield and the intake baffle are configured to be assembled as an enclosure for the variable frequency drive upon assembly.

17. The set of fire shields for a variable frequency drive of claim 10, wherein the intake baffle is a metal grill.

* * * * *